(12) United States Patent
Kasumi et al.

(10) Patent No.: US 8,973,495 B2
(45) Date of Patent: Mar. 10, 2015

(54) IMPRINT APPARATUS, IMPRINT METHOD, AND ARTICLE MANUFACTURING METHOD

(75) Inventors: Kazuyuki Kasumi, Utsunomiya (JP); Hideki Ina, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 1031 days.

(21) Appl. No.: 12/536,317

(22) Filed: Aug. 5, 2009

(65) Prior Publication Data

US 2010/0031833 A1 Feb. 11, 2010

(30) Foreign Application Priority Data

Aug. 6, 2008 (JP) ................................. 2008-203611

(51) Int. Cl.
   *G03F 7/00* (2006.01)
   *B82Y 10/00* (2011.01)
   *B82Y 40/00* (2011.01)

(52) U.S. Cl.
   CPC ............... *G03F 7/0002* (2013.01); *B82Y 10/00* (2013.01); *B82Y 40/00* (2013.01)
   USPC ................................................ 101/4; 101/32

(58) Field of Classification Search
   None
   See application file for complete search history.

(56) References Cited

U.S. PATENT DOCUMENTS

| 2005/0116370 A1 | 6/2005 | Ogino et al. |
| 2007/0145639 A1* | 6/2007 | Seki et al. ..................... 264/293 |
| 2008/0041816 A1* | 2/2008 | Choo .............................. 216/24 |

FOREIGN PATENT DOCUMENTS

| JP | 2002-283354 A | 10/2002 |
| JP | 2004-351693 A | 12/2004 |
| JP | 2005-135957 A | 5/2005 |
| JP | 2005-153091 | 6/2005 |
| JP | 2005-349619 A | 12/2005 |
| JP | 2006-015709 | 1/2006 |
| TW | 200738437 A | 10/2007 |
| TW | 295227 B | 4/2008 |

OTHER PUBLICATIONS

Office Action for TW Patent Application No. 098126280, Nov. 6, 2012.

* cited by examiner

*Primary Examiner* — Joshua D Zimmerman
(74) *Attorney, Agent, or Firm* — Canon USA Inc IP Division

(57) ABSTRACT

There is provided an imprint apparatus configured to perform an imprint in which a resin on a substrate is molded using a mold and a pattern is formed on the substrate. The apparatus includes a press unit configured to press the resin on the substrate and the mold to each other, a cure unit configured to irradiate light to the resin molded by the mold to cure the resin, and a movement unit configured to move the mold and the substrate, from a position at which the press is performed by the press unit to a position at which the light is irradiated by the cure unit, and from the position at which the light is irradiated by the cure unit to a position at which the mold is released.

10 Claims, 9 Drawing Sheets

IMPRINT APPARATUS, IMPRINT METHOD, AND ARTICLE MANUFACTURING METHOD

BACKGROUND OF THE INVENTION

1. Field of the Invention

The present invention relates to an imprint apparatus, an imprint method, and an article manufacturing method.

2. Description of the Related Art

A photocuring type nonimprint lithography method ("UV-NIL method" hereinafter) presses a transparent mold having a pattern against an uncured ultraviolet ("UV") curing resin on a substrate, irradiates the UV through the mold, cures the UV curing resin, and releases the mold. Japanese Patent Laid-Open No. ("JP") 2005-153091 (FIG. 9, paragraph no. 0067) proposes a nanoimprint apparatus that uses the UV-NIL method, arranges an alignment unit, a press unit, a release unit, etc. around a conveyance unit, and improves the throughput through simultaneous processing using a plurality of units. Both pressing and photocuring are performed in the press unit.

In order to simultaneously transfer a mold pattern on the whole surface of the substrate, it is necessary to an optical path used to irradiate the UV onto the whole surface of the substrate. Hence, it is known to use a mold larger than a substrate, to hold a region of the mold which does not overlap the substrate, and to provide an opening configured to transmit the UV to another region of the mold holder which overlaps the substrate. See JP 2006-15709.

However, JP 2005-153091 requires the press unit to house both the press mechanism and the UV irradiation mechanism, making complex the structure of the nanoimprint apparatus and degrading the maintainability. In addition, when the opening equal to or larger than the substrate is formed in the back surface of the mold as in JP 2006-15709, the mold, the mold holder, and the press mechanism become large and the cost increases. Moreover, it is difficult to form a pattern on a mold larger than a current silicon wafer having a diameter of 300 mm.

SUMMARY OF THE INVENTION

The present invention provides, for example, an imprint apparatus that is advantageous in at least one of throughput, maintenance, and manufacturing cost.

An imprint apparatus according to one aspect of the present invention for performing an imprint in which a resin on a substrate is molded using a mold and a pattern is formed on the substrate includes a press unit configured to press the resin on the substrate and the mold to each other, a cure unit configured to irradiate light to the resin molded by the mold to cure the resin, and a movement unit configured to move the mold and the substrate, from a position at which the press is performed by the press unit to a position at which the light is irradiated by the cure unit, and from the position at which the light is irradiated by the cure unit to a position at which the mold is released.

An imprint apparatus according to another aspect of the present invention for performing an imprint in which a resin on a substrate is molded using a mold and a pattern is formed on the substrate includes a press station in which the resin on the substrate and the mold are pressed to each other, a release station in which the mold is released from the resin that has been cured on the substrate, and a cure unit located between the press station and the release station, and configured to irradiate light to the resin between the mold and the substrate to cure the resin.

An imprint method configured to perform an imprint in which a resin on a substrate is molded using a mold and a pattern is formed on the substrate includes a press step of pressing the resin on the substrate and the mold to each other, a cure step of irradiating light to the resin molded by the mold to cure the resin, and a release step of releasing the mold from the resin that has been cured on the substrate.

Further features of the present invention will become apparent from the following description of exemplary embodiments with reference to the attached drawings.

DESCRIPTION OF THE EMBODIMENTS

A description will now be given of embodiments of the present invention with reference to the accompanying drawings.

First Embodiment

Figure 1:
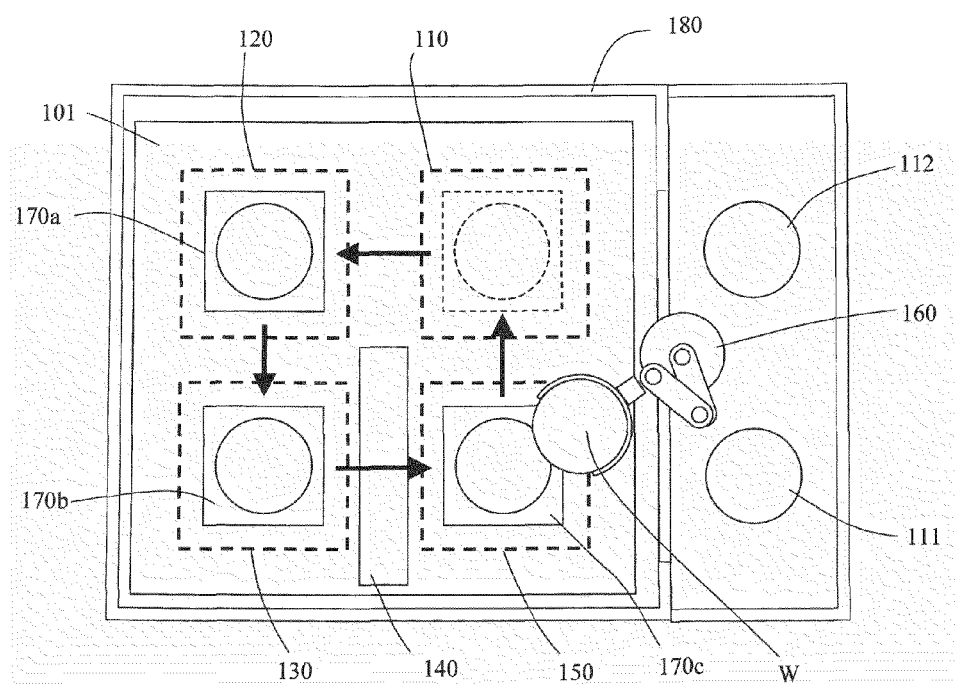
FIG. 1 is a block diagram of a nanoimprint apparatus according to a first embodiment.

FIG. 1 is a block diagram of a nanoimprint apparatus of the UV-NIL method according to a first embodiment. This nanoimprint apparatus uses a mold M as wide as a substrate W to be transferred (which will be simply referred to as a "substrate" hereinafter), and simultaneously transfers a pattern onto a whole surface of the substrate W. This embodiment prevents a cost increase because it does not use a mold larger than the substrate W.

The nanoimprint apparatus includes a substrate loading station 110, a press station 120, an alignment station 130, a cure unit 140, a release station 150, and a conveyance robot 160. Thus, the throughput improves due to batch processing of a plurality of units.

More specifically, there are provided three movement table (or units) 170a to 170c, which sequentially move among the respective stations and simultaneously perform the nanoimprint process for efficient nanoimprint. In this specification, reference numeral "170" generalizes "170a to 170c." The whole nanoimprint apparatus is enclosed by a chamber 180, and its temperature and cleanness are controlled.

Figure 2:
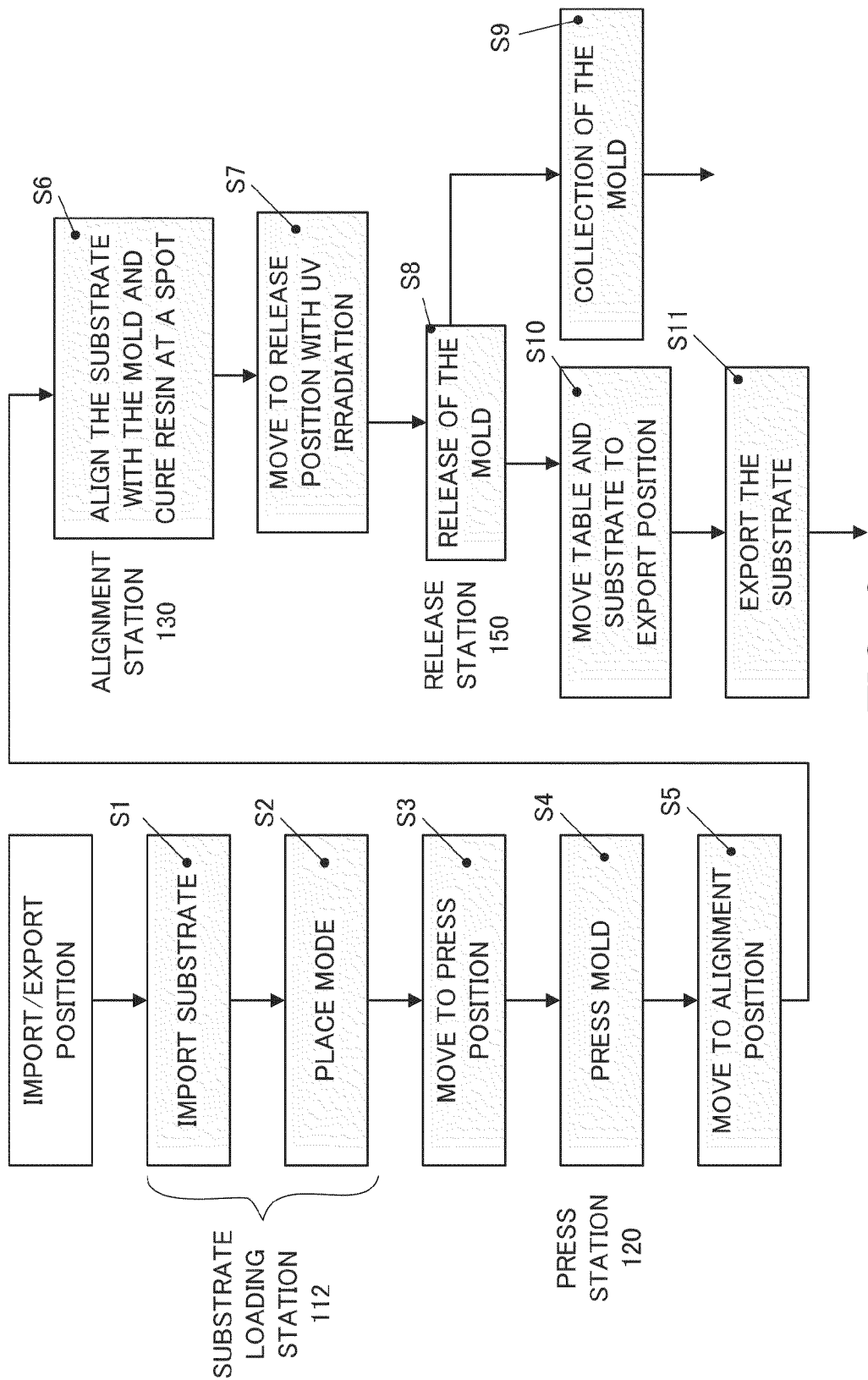
FIG. 2 is a flowchart of a transfer action of the nanoimprint apparatus shown in FIG. 1.

FIG. 2 is a flowchart of a transfer action. In FIG. 2, "S" is an abbreviation of a step. A substrate storage unit 112 stores a substrate W whose surface has been previously coated with UV curing resin (which will be simply referred to as "resin" hereinafter) by a spin coater, etc., outside of the imprint apparatus, and the conveyance robot 160 places the substrate W onto the movement table in the substrate loading station 110 from the substrate storage unit 112 (S1). Next, the conveyance robot 160 places a mold M stored in a mold storage unit 111, onto the substrate W (S2). A patterned surface of the mold M faces and then contacts the resin P on the substrate W. Next, the movement table 170 moves to the press station 120 (S3), and a press mechanism in the press station presses the mold M against the resin on the substrate W (S4). Due to this press action, the resin P on the substrate W flows along the mold pattern shape, and the residual coating on the patterned surface comes to have a predetermined thickness.

Next, the movement table 170 moves the substrate W and the mold M to the alignment station 130 (S5). The alignment station 130 provides an alignment between the substrate W and the pattern of the mold M. Since the uncured resin P is filled in a space between the substrate W and the mold M, a large power is necessary to separate the mold M from the substrate W in the vertical direction. On the other hand, the mold M can be moved with a comparatively small power in the horizontal direction on the substrate W. The alignment station 130 measures relative positions of the mold M and the substrate W through an alignment measurement unit, and aligns the mold M with the substrate W by correcting a shift amount based on the measurement result (S6). After the alignment, a fixation device fixes the mold M and the substrate W on the alignment station 130 so as to prevent a shift between them.

Thereafter, the movement table 170 moves to the release station 150 after passing through the lower side of the cure unit 140 (S7). At that time, the cure unit 140 irradiates, from the top of the mold M, the UV (light) having a stripe shape equal to or larger than a width of the mold M, and cures the resin P. The release station 150 releases the mold M from the substrate W (S8). The released mold M is returned to the mold storage unit 111 (S9). The pattern has been transferred onto the cured resin on the substrate W, and the substrate W is moved to the export position (S10), and exported to the substrate storage unit 112 (S11).

Figure 3:
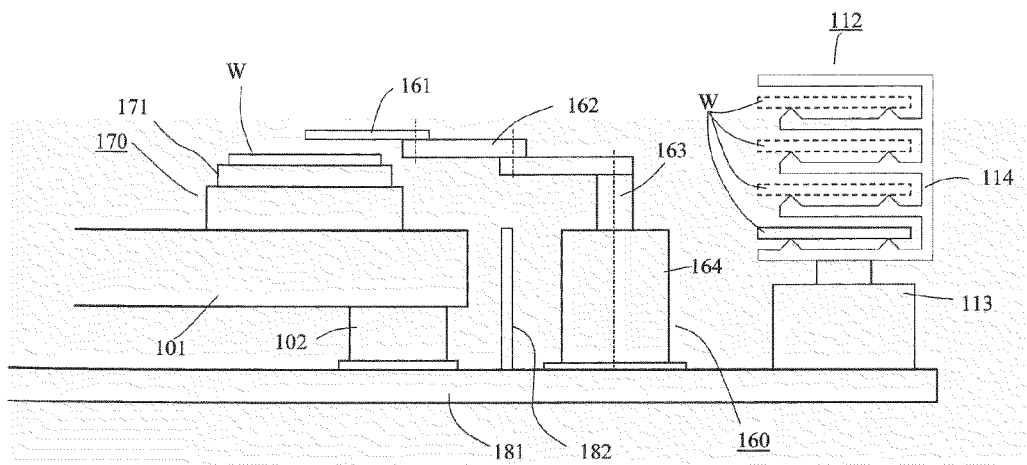
FIG. 3 is a sectional view of a substrate loading station, a substrate storage unit, and a conveyance robot in the nanoimprint apparatus shown in FIG. 1.

FIG. 3 is a sectional view of the substrate loading station 110, the substrate storage unit 112, and the conveyance robot 160.

The substrate storage unit 112 has a substrate cassette 114 and a substrate elevator mechanism 113. The substrate cassette 114 can house a plurality of substrates W, each having a surface coated with the resin thin by a spin coater, etc., outside of the imprint apparatus, and the substrate cassette 114 holds a back surface of each substrate W. The substrate cassette 114 is installed on the substrate elevator mechanism 113 in the substrate storage unit 112 by an operator.

The conveyance robot 160 is a scalar robot configured to import or export the substrate W and the mold M, and includes a robot hand 161, a robot arm 162, a robot rod 163, and a robot body 164. The robot hand 161 serves to grip outer-circumference side surfaces of the substrate W and the mold M. The robot rod 163 axially rotates to move a work both in the circumferential direction, and move the work in the vertical direction. The robot arm 162 bends and serves to move the work in the radial direction.

A table 101 supports major components in the imprint apparatus and a movement surface of each movement table, and is mounted on a foundation frame 181 via a vibration resistance mechanism 102. The table 101 has a rectangular shape (see FIG. 1), and at least three vibration resistance mechanisms 102 are provided. A surface of the table 101 is processed with superior flatness, and forms a base of the movement plane of the movement table. The movement table 170 moves on the surface of the table 101 among the stations, and has a built-in movement mechanism (not shown). The movement table 170 is mounted with a substrate chuck 171 configured to absorb and hold the substrate W. Numeral 182 in FIG. 3 denotes a partition configured to prevent an entry of a particle from the side of the conveyance robot 160.

Figure 4:
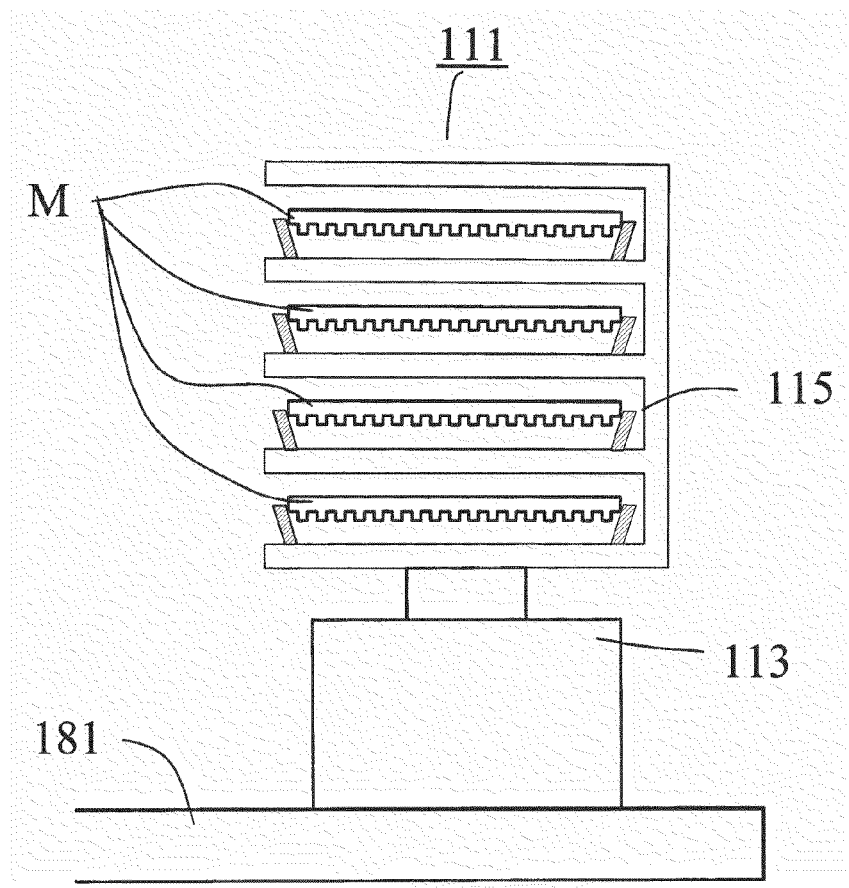
FIG. 4 is a sectional view of the mold storage unit in the nanoimprint apparatus shown in FIG. 1.

FIG. 4 is a sectional view of the mold storage unit 111. The mold storage unit 111 is adjacent to the substrate storage unit 112, as shown in FIG. 1 so that the conveyance robot 160 can access the mold storage unit 111. The mold storage unit 111 has a mold cassette 115 on the substrate elevator mechanism 113 similar to the substrate storage unit 112. The mold cassette 115 and the substrate cassette 114 have equivalent and replaceable interfaces. The mold cassette 115 stores a plurality of mold M in its inside while a patterned surface of each mold M faces down. In order not to touch the patterned surface of the mold M, a side surface of the mold M is set to a contact surface and the contact surface is arranged at a position that does not interfere with the robot hand 161 of the conveyance robot 160.

In operation of the substrate loading station 110, the substrate elevator mechanism 113 is operated and moved to the predetermined height in order to take a predetermined substrate W out of the substrate cassette 114. Next, the conveyance robot 160 takes the substrate W out of the substrate cassette 114 and places it onto the movement table 170 that stops in the substrate loading station 110. Next, the conveyance robot 160 takes a predetermined mold M out of the mold storage unit 111, and places it on the substrate W. The movement table 170 moves to the press station 120 while the movement table 170 is mounted with a pile of the substrate W and the mold M.

Figure 5:
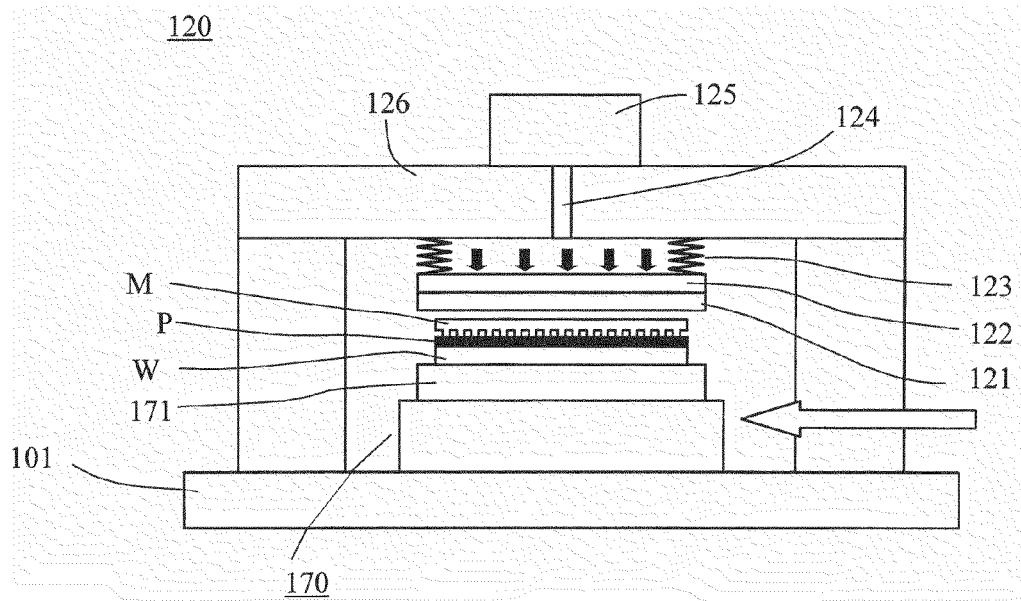
FIG. 5 is a sectional view of a press (or imprint) station of the nanoimprint apparatus shown in FIG. 1.

FIG. 5 is a sectional view of the press station 120. The press station 120 is a part of the imprint apparatus in which a press unit configured to apply a pressure between the substrate W and the mold M. The press station 120 is supported on the table 101 via a press station frame 126. The press station frame 126 has a gate shape, and the movement table can be inserted into a lower side of the press station 126. The press station 120 applies a pressure to the mold M and the substrate W by pressing against the top of the mold M a pad 121 that is slightly larger than the substrate W. This configuration fills the resin in the patterned shape of the mold M, and makes uniform the residual film at part having no pattern (or at the bottom part of the pattern). The pad 121 is made of a soft material, such as silicone rubber, so as not scratch the back surface of the mold M (or the top surface in FIG. 5).

The pad 121 is attached to a press plate 122, and the press plate 122 is made of a highly rigid material and attached to a ceiling of the press station frame 126 via a bellows 123. By controlling the internal pressure of the bellows 123, the pad 121 can be moved vertically or the pressing of the pad 121 can be controlled. A pressure unit 125 controls the pressure via a channel 124 provided in the press station frame 126. The pressure unit 125 may use a compressor, a pressure sensor, and a valve, etc., and can control the internal pressure of the bellows 123 to a predetermined value.

When the movement table 170 moves while the mold M is piled over the substrate W in the press station 120, the press unit 125 increases the pressure. As a result, the pad 121 presses the back surface (or the top surface shown in FIG. 5) of the mold M and the pressure is applied both to the mold M and the substrate W. When a predetermined pressure is maintained for a predetermined time period, the resin P flows along the mold pattern shape, (so-called residual) thicknesses of the resin at the convexes of the mold pattern becomes a predetermined thickness. Thereafter, the press unit 125 controls the inside of the bellows to a negative pressure to move up the pad 121. Thus, the operation of the press station 120 ends.

Figure 6:
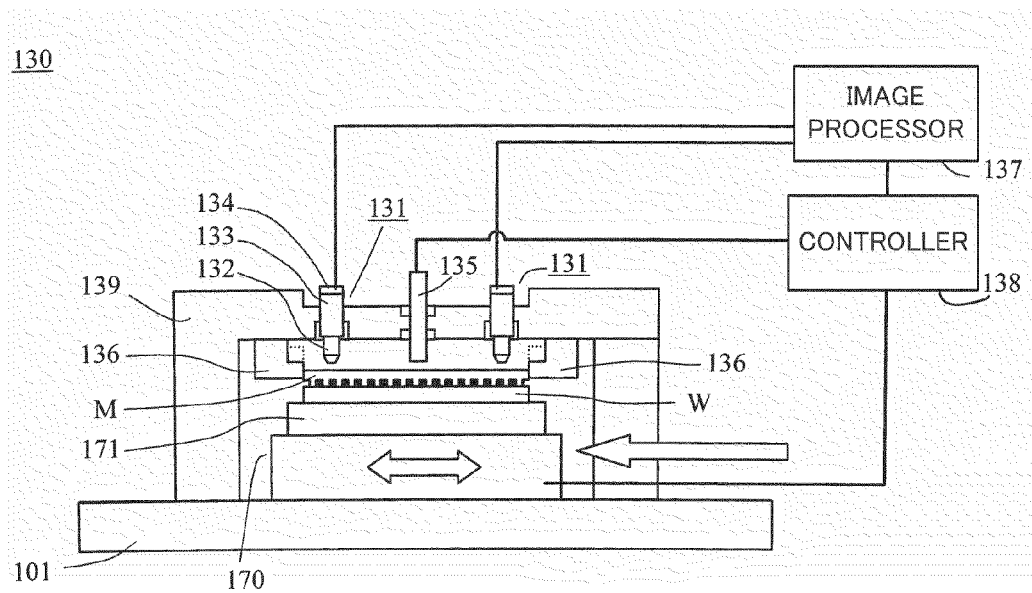
FIG. 6 is a sectional view of an alignment station of the nanoimprint apparatus shown in FIG. 1.

The movement table 170 moves to the alignment station 130 (see FIG. 1) while the movement table 170 is mounted with a pile of the substrate W and the mold M. FIG. 6 is a sectional view of the alignment station 130. The alignment station 130 precisely aligns the mold M with the substrate W and fixes them so as to prevent a shift between them. The alignment station 130 includes two alignment scopes 131, a UV spot light irradiator 135, three substrate stoppers 136, and a controller 138.

The two alignment scope 131 are fixed onto the alignment station frame 139, and used to observe a vicinity of the outer circumference of the mold M. The alignment scope 131 includes an observation lens 132 and an optical system configured to project an optical image of an alignment mark captured by the observation lens 132 onto an image pickup sensor 134, and serves to adjust a focus position. The alignment scope 131 further includes an alignment scope body 133 that houses an illumination optical system, and the image pickup sensor 134 configured to convert the optical image of the alignment mark into an electric signal.

The UV spot light irradiator (light irradiation unit) 135 is located at an approximately center of the mold M. The UV spot light irradiator 135 serves as a fixation device configured to fix the mold M onto the substrate W by irradiating the UV in a spot shape onto the central part of the substrate W and by curing part of resin so as to prevent a shift between the mold M and the substrate W that have been aligned with each other.

The three substrate stoppers 136 support the peripheral side surface of the mold M. The substrate stoppers 136 positions the mold M in place by pressing the end surface of the mold M. After the mold M is conveyed to the predetermined position of the alignment station 130, the substrate stoppers 136 move down and press the mold M or hold its periphery. Thereby, the mold M is positioned on the basis of its external shape in the alignment station 130. The alignment mark can be found in the observation field of the alignment scope 131.

The controller 138 processes an image captured by the alignment scope 131, and controls the image processor 137 configured to calculate a shift amount between the mold M and the substrate W, an alignment operation, and the UV spot light irradiator 135.

The substrate stoppers 136 are configured to move up in the initial state. The movement table 170 moves to the alignment station 130 while the movement table 170 is mounted with the mold M and the substrate W. Thereafter, the substrate stoppers 136 move down and hold the mold M, and the mold M is slightly moved up above the substrate W. The alignment scope 131 takes images of the alignment mark (not shown) formed on the mold M and the alignment mark (not shown) formed on the substrate W, and the image processor 137 calculates a shift amount of these two marks. The controller 138 obtains the result, and issues a positioning drive command to the movement table 170. The movement table 170 moves by a commanded driving amount. Since a position of the mold M is fixed by the substrate stoppers 136, only the substrate W moves. The controller 138 repeats measuring of the alignment mark and driving of a movement table, recognizes that positioning ends when a shift amount between the relative positions of the mold M and the substrate W is equal to or smaller than a threshold, and instructs the UV spot light irradiator 135 to irradiate the UV. When the UV spot light is irradiated, the resin P at the center part between the mold M and the substrate W cures and the mold M and the substrate W are fixed without a shift between them. The substrate stoppers 136 release the support of the mold M and move up. Thus, the operation of the alignment station 130 ends.

Figure 17:
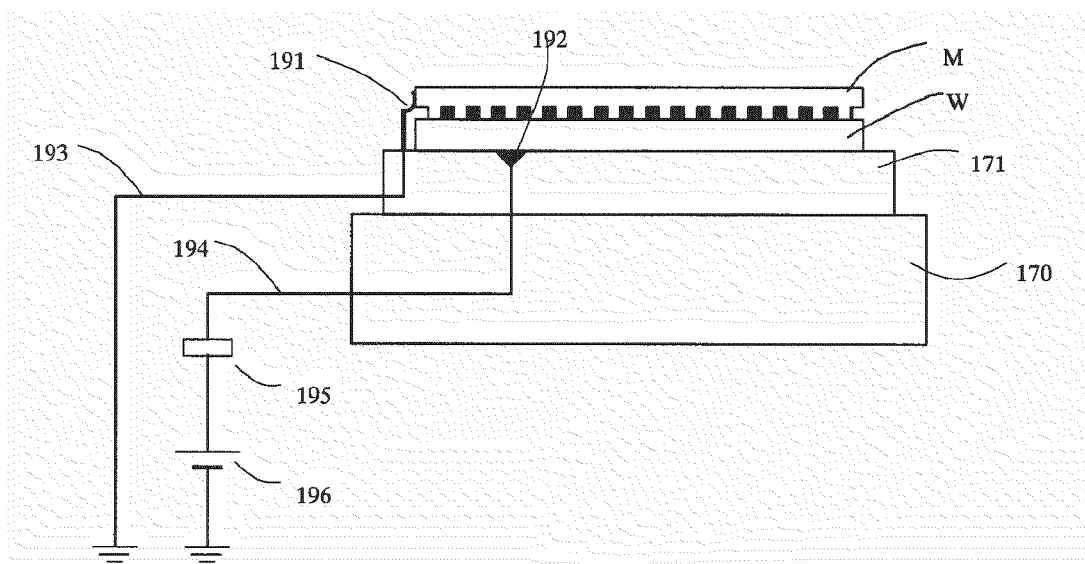
FIG. 17 is a sectional view of an alternate of a fixation device.

Instead of the UV spot light irradiator 135, a fixation device shown in FIG. 17 may be used to fix the mold M and the substrate W by absorbing them with an electrostatic force. A mold side electrode 191 is provided on the side surface of the substrate chuck 171, and contacts the side surface of the mold M. The mold side electrode 191 is electrically grounded via a mold side wire 193. A substrate side electrode 192 is provided on the surface of the absorption surface of the substrate chuck 171 (on which the substrate W is to be absorbed). The substrate side electrode 192 is grounded thorough the substrate side wire 194 via a switch 195 and a power supply 196. When the alignment measurement and the alignment between the mold M and the substrate W are completed, the switch 195 is short circuited to generate a potential difference between the mold M and the substrate W, and to draw the mold M to the side of the substrate chuck by the electrostatic force. Thereby, the mold M and the substrate W are fixed without a shift.

Alternatives are conceivable other than the fixation device shown in FIG. 17, such as an addition of a magnetic material to the mold M, a fixation of the mold M by arranging an electromagnet in the substrate chuck and flowing the current in the electromagnet, or a mechanical means for fixing the mold M and the substrate W.

Figure 7A:
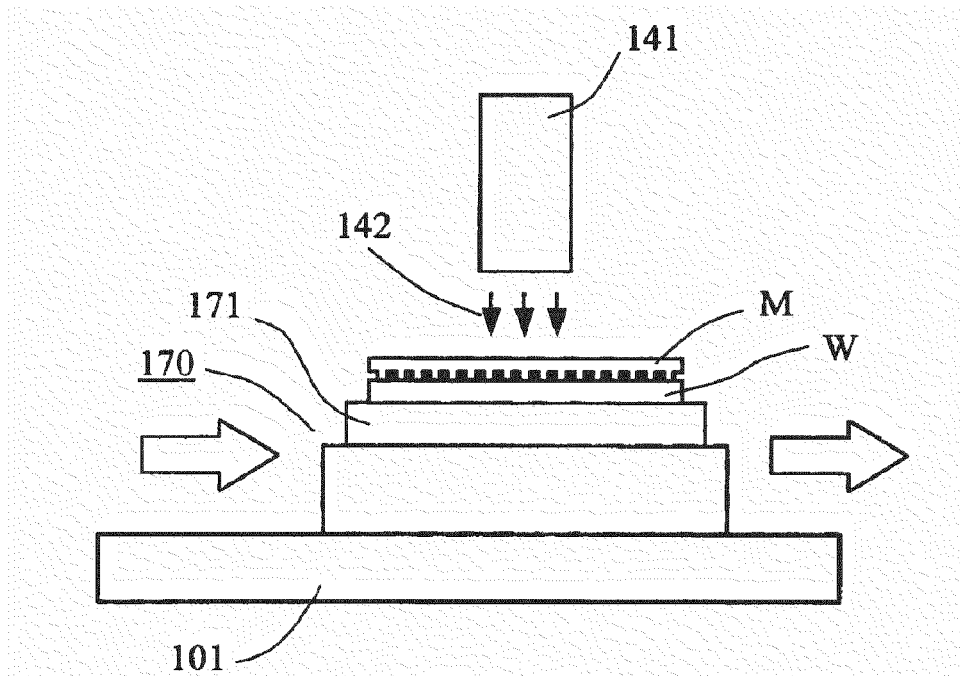
FIGS. 7A and 7B are sectional views of a cure unit of the nanoimprint apparatus shown in FIG. 1.
Figure 7B:
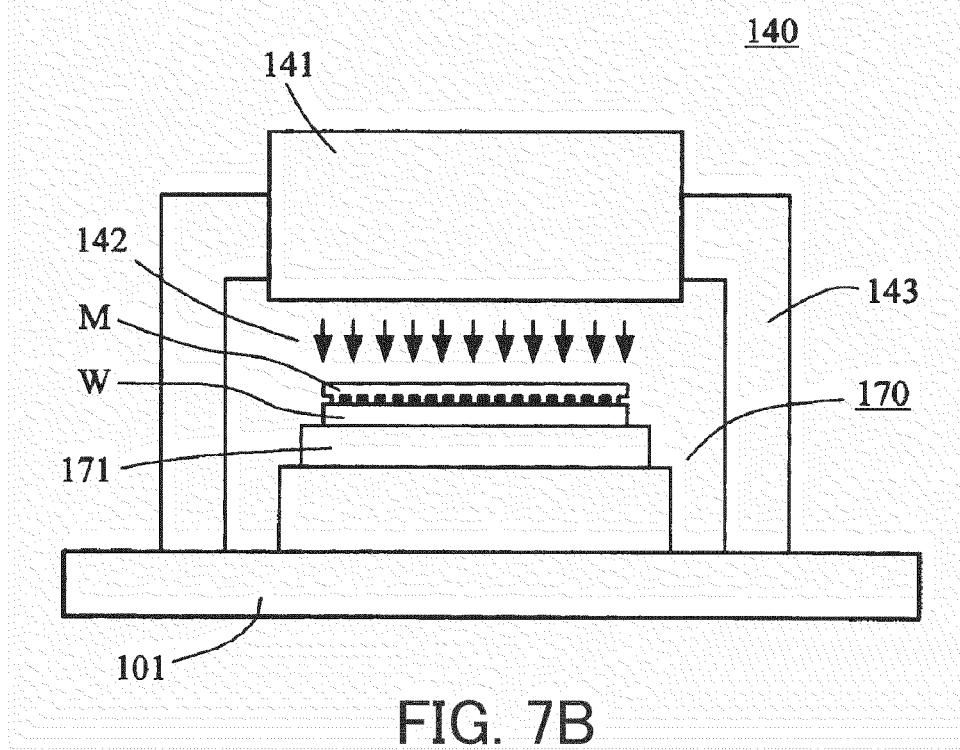

Next, the movement table moves to the release station position through the cure unit. FIGS. 7A and 7B are sectional views of the curing unit 140. The cure unit 140 cures the resin P by irradiating UV onto the whole surface through the mold M. The UV is irradiated onto the resin on the whole surface of the substrate when the mold M and the substrate W mounted on the movement table 170 pass under the cure unit 140 that generates the stripe-shaped UV. FIG. 7A is a sectional view along the moving direction, and FIG. 7B is a sectional view perpendicular to the moving direction.

The cure unit 140 has a UV irradiator (light irradiator) 141 at the ceiling part of the cure unit frame 143 having a gate shape. Reference numeral 142 denotes the UV. The UV 142 is irradiated onto a range that has a length longer than the substrate's width. The irradiation amount of the UV 142 may be adjusted by the moving velocity of the movement table. The UV irradiator 141 is mounted with an internal UV light source, such as an LED or a mercury lamp, an optical system configured to shape the light into a stripe shape, and a filter or a shutter configured to adjust the light quantity. The UV occurs only when the movement table 170 passes under the cure unit 140. Since the cure unit 140 is provided at a position different from that of the press station 120 or the alignment station 130, the imprint apparatus has a simple structure and is superior in maintainability and manufacturing cost reduction. While the movement table 170 moves, the cure step ends, and the movement table 170 stops at the position of the release station (see FIG. 1). While this embodiment irradiates the UV 142 onto the whole surface by moving the mold M and the substrate W under the stripe-shaped UV 142, an alternative embodiment provides an illumination optical system configured to simultaneously irradiate the whole surface of the substrate to the imprint apparatus, and to irradiate the UV 142 for simultaneous curing while the conveyance unit is stopped.

Figure 8:
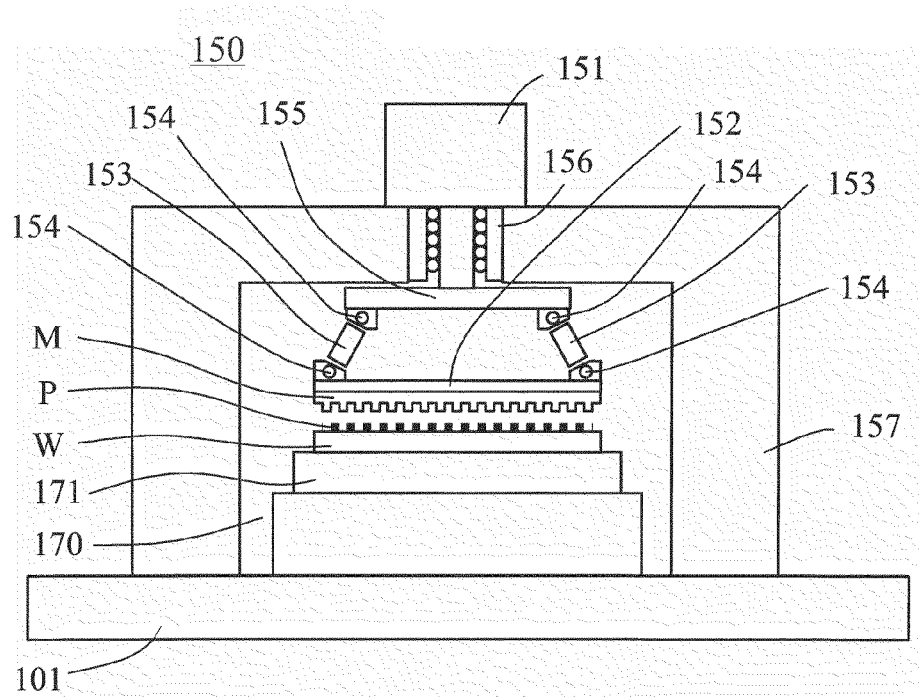
FIG. 8 is a sectional view of a release station of the nanoimprint apparatus shown in FIG. 1.

FIG. 8 is a sectional view of the release station 150. Since the cured resin works as an adhesive agent, the mold M and the substrate W adhere to each other. The release station 150 releases the mold M from the substrate W. The release station 150 has a release mechanism on a release station frame 157. The release mechanism includes a mold chuck 152 configured to hold the mold M, arms 153 connected to the mold chuck 152 and a release unit elevator 155 via links 154, and a release-driving unit 151 configured to vertically drive the release unit elevator 155. The release mechanism further includes an elevator guide 156 configured to guide the release unit elevator 155 in the driving direction.

The movement table 170 moves to the release station 150 while the movement table 170 is mounted with the mold M and the substrate W in which curing has been completed. At this time, the mold chuck 152 is moved up by the release driving unit 151 so as to prevent the interference between the mold chuck 152 and the mold M. After the movement ends, the mold chuck 152 is moved down by the release-driving unit 151 and contacts the mold M. At this state, the mold chuck 152 absorbs the back surface of the mold M. After the absorption is made, the release-driving unit 151 moves up the release unit elevator 155, and releases the mold M from the substrate W. At this time, the link mechanism applies a tensile force to the outer circumferential part of the mold chuck 152, and the mold M warps slightly. As a result, the release of the mold starts from the circumferential part of the mold M, and the release advances to the central part. The release of the mold advances linearly and smoothly. Thereafter, the release action ends when the mold M is moved up to a predetermined position.

The mold M is held by the mold chuck 152, and the substrate W is held by the substrate chuck 171 of the movement table 170. The substrate W is collected into the substrate stage unit 112 by the conveyance robot 160. Next, the mold M is collected into the mold storage unit 111 by the conveyance robot 160.

Thus, a series of nanoimprint process is completed. This imprint apparatus has three movement tables 170, and provides continuous and parallel imprint operations by sequentially importing the mold M and the substrate W. After a series of operations is completed, the mold M may be conveyed to the substrate loading station 110 mounted with the next substrate W rather than collecting the mold M in the mold storage unit 111. As a result of that the movement table 170 sequentially moves in order from the substrate loading station 110, the press station 120, the alignment station 130, the cure unit 140, and the release station 150, the function does not concentrate on one location. As a consequence, the imprint apparatus has a simple structure, improves the maintainability, and reduce its cost and the running cost. In addition, a plurality of movement tables 170 may be mounted to improve the productivity through the parallel operations.

Second Embodiment

Figure 9:
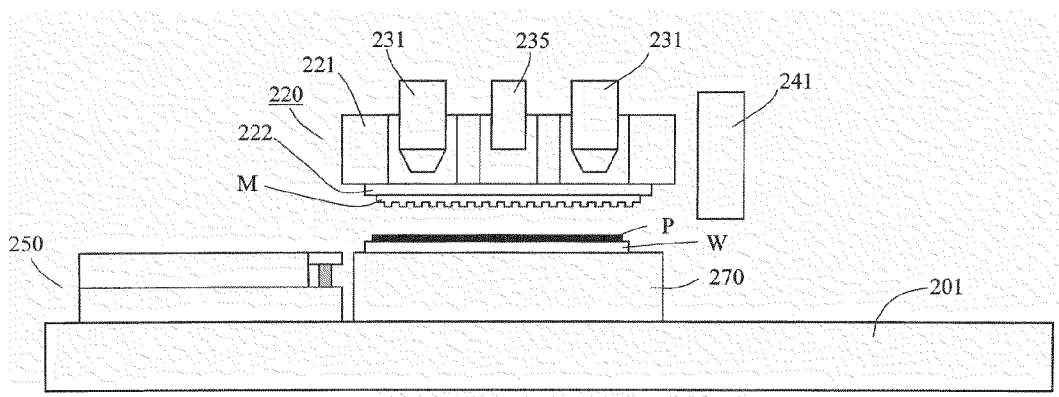
FIG. 9 is a sectional view of the imprint apparatus that provides simultaneous transferring onto a substrate according to a second embodiment.

FIG. 9 is a sectional view of a principal part of the nanoimprint apparatus configured to provide whole transfer onto the substrate W according to a second embodiment. The nanoimprint apparatus includes a table 201, a substrate stage 270, a press unit 220, a UV irradiator 241, and a release unit 250. The top surface of the table 201 serves as a base plane on which the substrate stage 270 and the release unit 250 move. The substrate stage 270 and the release unit 250 can move in the horizontal direction in FIG. 9, but can move only a small stroke necessary for an alignment in the vertical direction in FIG. 9. A mold chuck 222 is provided at the bottom of a press elevator 221. A pair of alignment scopes 231 is provided at two openings at the end of the press unit elevator 221, and the UV spot light irradiator 235 is provided at the central opening. The mold chuck 222 holds the mold M, and vertically moves together. Reference numeral 241 denotes a UV irradiator configured to irradiate down the stripe-shaped UV, as in the first embodiment. The release unit 250 can move on the table 201 independent of the substrate stage 270, and releases the mold M that has been adhered to the substrate W after curing is completed. A structure of the release unit 250 will be described later.

In FIG. 9, the mold M is conveyed by a conveyance means (not shown), and held by the mold chuck 222. The mold M is positioned by the alignment means (not shown) so that the alignment mark formed on the mold M accords with a measurement position of each alignment scope 231. The substrate W is held by the substrate stage 270 by a conveyance means (not shown). The resin P has been applied to a surface of the substrate W.

Figure 10:
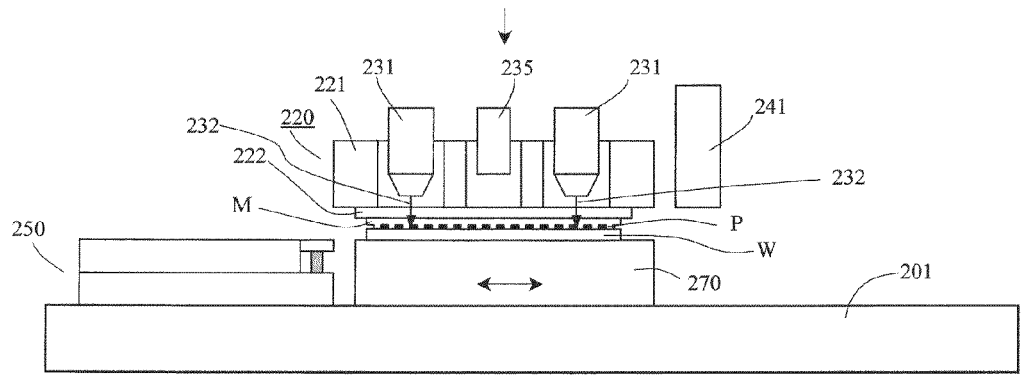
FIG. 10 is a sectional view for explaining an alignment completion state in the nanoimprint apparatus shown in FIG. 9.

The substrate stage 270 is positioned so that the mold M opposes to the substrate W. At this state, the press unit 220 is driven and the mold M is pressed against the substrate W. After the press action ends, each alignment scope 231 is used to observe the alignment marks on the mold M and the substrate W, and to measure a positional shift amount between the mold M and the substrate W. The substrate stage 270 is driven on the basis of the measurement result, and positioning to the predetermined position is provided. FIG. 10 shows that positioning is completed. Reference numeral 232 denotes alignment light.

Figure 11:
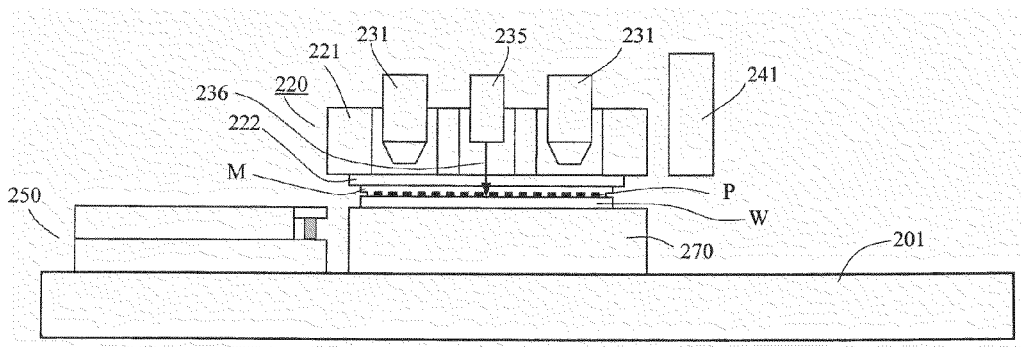
FIG. 11 is a sectional view for explaining an irradiation state of the UV spot in the nanoimprint apparatus shown in FIG. 9.

After positioning ends, the UV spot light irradiator 235 irradiates the UV spot light onto the approximately centers of the mold M and the substrate W as shown in FIG. 11, and partially cures the resin. Reference numeral 236 denotes the UV spot. Curing fixes the mold M and the substrate W, which have been positioned relative to each other, and no shift occurs. Like the first embodiment, the electrostatic force or a magnetic or mechanical clamp shown in FIG. 17 may be used for the fixation.

Figure 12:
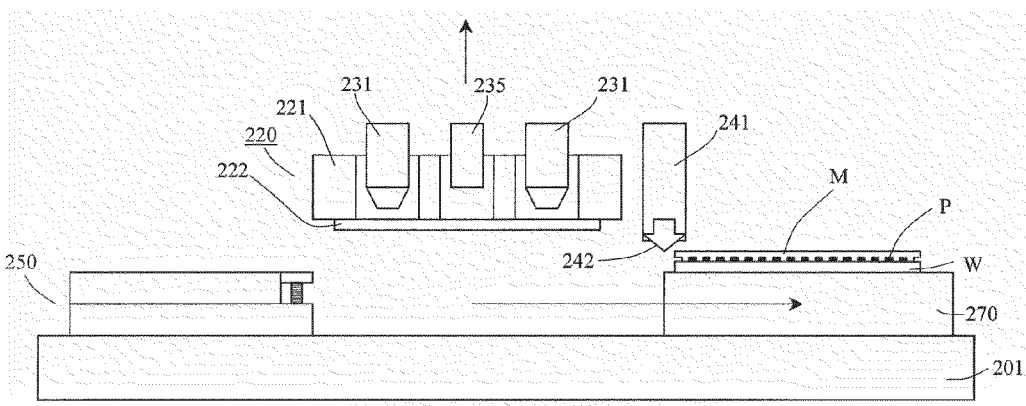
FIG. 12 is a sectional view for explaining a cure completion state in the nanoimprint apparatus shown in FIG. 9.

After the UV spot is irradiated, the mold chuck 222 frees the mold. The press unit elevator 221 moves up, and the press unit 220 retreats, leaving the mold M on the substrate W. Thereafter, the substrate stage 270 starts a lateral movement. Simultaneously, the UV irradiator 241 starts irradiations of the UV 242. The UV irradiator 241 is configured to irradiate the UV having a stripe shape longer than the substrate W, and cures the resin when the substrate stage 270 mounted with the mold M and the substrate W passes under the UV irradiator 241. FIG. 12 shows that curing is completed. At this state, curing of the resin is completed. While the above description irradiates the UV while the substrate state 270 moves, an alternative embodiment may cure the resin by providing an illumination optical system configured to illuminate the whole surface of the substrate simultaneously, and by irradiating the UV onto the whole surface after the movement.

Figure 13:
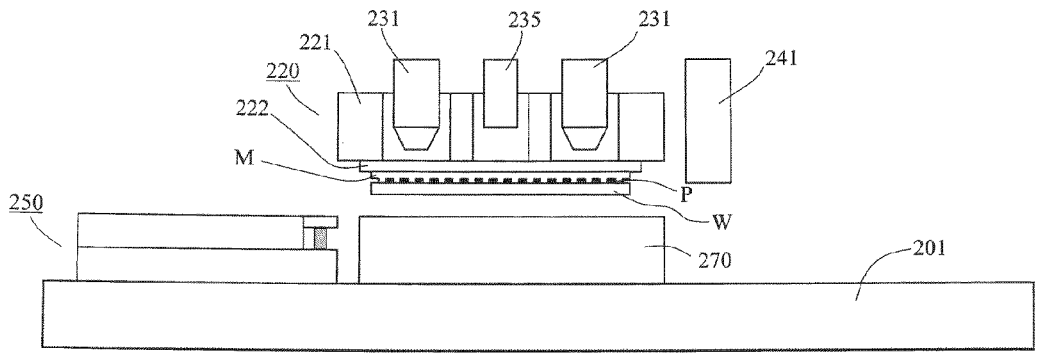
FIG. 13 is a sectional view for explaining an integral holding state of a substrate and a mold on a mold chuck in the nanoimprint apparatus shown in FIG. 9.

Next, the substrate stage 270 returns to a position opposite to the press unit 220. At this state, the press unit 220 descends, and the mold chuck 222 contacts the mold M. Thus, the mold chuck 222 absorbs the mold M there. The substrate stage 270 frees the substrate W. The mold M and the substrate W are in the adhesion state since the resin has been cured. When the press unit 220 moves up while the mold M is absorbed, the mold M and the substrate W are moved up together, and the substrate W is released from the substrate stage 270. FIG. 13 shows this state.

Figure 14:
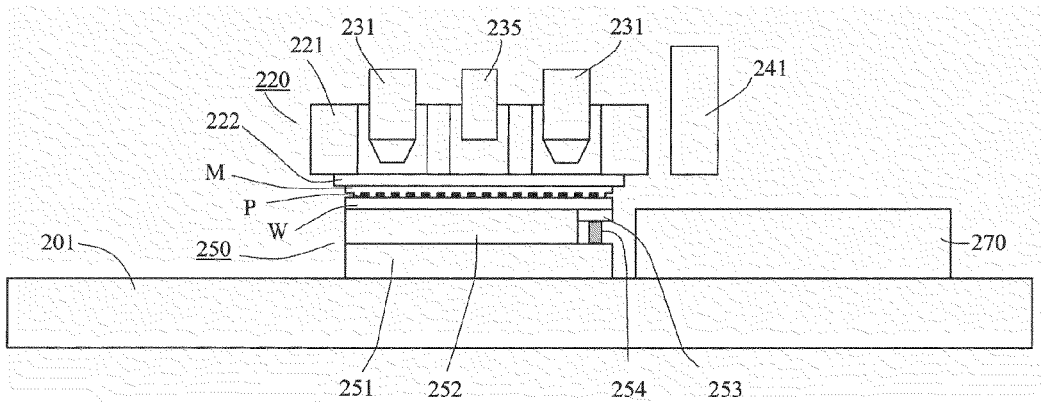
FIG. 14 is a sectional view for explaining a release-starting state in the nanoimprint apparatus shown in FIG. 9.

Next, as soon as the substrate stage 270 retreats in the lateral direction, the release unit 250 moves to the lower part of the press unit. The release unit 250 includes substrate chucks 252 and 253, and a release-starting driver 254 on a release base 251 that moves on the table 201, as shown in FIG. 14. The release unit 250 is a unit configured to partially release the end of the substrate W when the substrate chuck 253 is driven down by the release-starting driver 254, to make the release starting point, and to facilitate the release of the mold.

Figure 15:
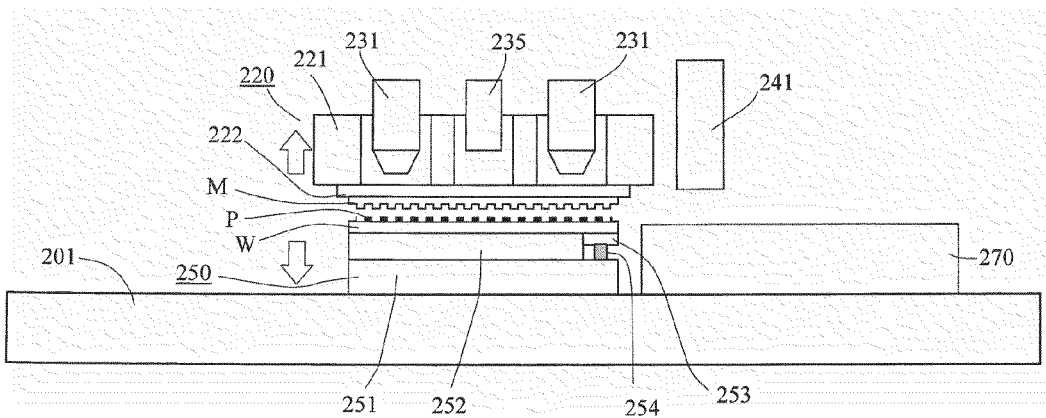
FIG. 15 is a sectional view of a release completion state in the nanoimprint apparatus shown in FIG. 9.

When the press unit 220 descends while facing the release unit 250, the mold M and substrate W contacts the substrate chucks 252 and 253. At this state, the substrate chucks 252 and 253 absorb the substrate W. Then, when the release-starting driver 254 is driven to draw down the substrate chuck 253, the release of the mold starts. The mold is released by simultaneously driving the elevator mechanism in the release unit 250 and the elevator mechanism of the press unit 220. FIG. 15 shows the release completion state.

Figure 16:
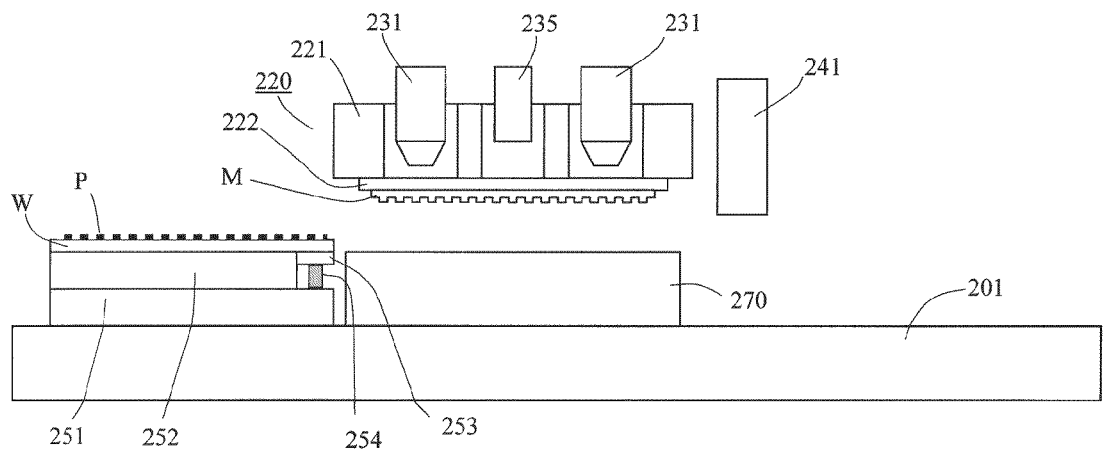
FIG. 16 is a sectional view for explaining a nanoimprint completion state in the nanoimprint apparatus shown in FIG. 9.

Thereafter, the release unit 250, the substrate stage 270, and the press unit 220 are driven to the initial positions. FIG. 16 shows this state. Thereafter, the substrate W onto which the pattern has been transferred is collected by a conveyance means (not shown).

Conventionally, the alignment scope must be retreated to the outside of the substrate W so as to prevent the interference between the alignment scope and the UV irradiation means, but this embodiment provides the UV irradiation means at a position different from that of the press position or the alignment position. Since the whole substrate can be cured without retreating the alignment scope, the structure of the press unit can be made simple, the maintainability improves, and the manufacturing cost reduces. In addition, unlike the prior art example that moves to perform the press action after the alignment action, the apparatus of this embodiment provides an alignment between the substrate and the mold after the press action to prevent a shift by the fixation means, realizing a more precise alignment.

A manufacturing method of a device, such as a semiconductor integrated circuit device or a liquid crystal display device, includes the steps of transferring a pattern onto a substrate, such as a wafer, a glass plate, or a film-shaped substrate, using the above nanoimprint apparatus, and etching the substrate. An article manufacturing method of manufacturing a medium or an article, such as a patterned medium, does not require the etching step, but instead the step of processing the transferred substrate. While each embodiment uses the UV as the light for curing the resin, light other than the UV may be used as long as it serves as resin curing light. Therefore, the present invention is not limited to these embodiments.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-203611, filed Aug. 6, 2008, which is hereby incorporated by reference herein in its entirety.

What is claimed is:

1. An imprint apparatus for performing an imprint in which a resin on a substrate is molded using a mold and a pattern is formed on the substrate, the apparatus comprising:
   a press unit configured to press the mold to the resin on the substrate;
   an alignment unit configured to perform alignment between the mold that has been pressed to the resin by the press unit and the substrate;
   a fixation device configured to fix relative positions of the mold and the substrate between which the alignment has been performed by the alignment unit;
   a cure unit configured to irradiate light to the resin molded by the mold to cure the resin; and
   a movement unit configured to move the mold and the substrate from a first position at which the alignment is performed by the alignment unit via a second position at which the light is irradiated by the cure unit to a position at which the substrate is exported from the movement unit;
   wherein the cure unit is configured to irradiate the light to the resin on the substrate while the substrate is being moved by the movement unit from the first position to the third position via the second position.

2. An apparatus according to claim 1, wherein the fixation device is configured to irradiate light to cure only a part of the resin that is located between the mold and the substrate at the third position where the alignment is performed by the alignment unit.

3. An imprint apparatus for performing an imprint in which a resin on a substrate is molded using a mold and a pattern is formed on the substrate, the apparatus comprising:
   a press station in which the mold is pressed to the resin on the substrate;
   an alignment station in which alignment is performed between the mold that has been pressed to the resin in the press station and the substrate;
   a fixation device configured to fix relative positions of the mold and the substrate between which the alignment has been performed in the alignment station;
   a release station in which the mold is released from the resin that has been cured on the substrate, and the substrate is moved to an export position and exported therefrom; and
   a cure unit located between the alignment station and the release station, and configured to irradiate light to the resin between the mold and the substrate of which the relative positions have been fixed, to cure the resin between the mold and the substrate;
   wherein the cure unit is configured to irradiate the light to the resin on the substrate while the substrate is being moved from the alignment station to the export position.

4. An imprint method configured to perform an imprint in which a resin on a substrate is molded using a mold and a pattern is formed on the substrate, the method comprising:
   a press step of pressing the resin on the substrate and the mold to each other;
   a cure step of irradiating light to the resin molded by the mold to cure the resin;
   a release step of releasing the mold from the resin that has been cured on the substrate;
   an alignment step of aligning the mold and the substrate with each other while the mold contacts the resin, after the press step, wherein the cure step irradiates the light to the resin while the mold and the substrate, that have been aligned with each other in the alignment step, are moved; and a fixation step of fixing relative positions of the mold and the substrate that have been aligned with each other in the alignment step.

5. A method according to claim 4, wherein the fixation step fixes the relative positions by irradiating light for curing part of the resin that is located between the mold and the substrate.

6. A method of manufacturing an article, the method comprising:
   performing an imprint, in which a pattern is formed on a substrate, using an imprint apparatus defined in claim 1; and
   processing the substrate subjected to the imprint to manufacture the article.

7. A method of manufacturing an article, the method comprising:
   performing an imprint, in which a pattern is formed on a substrate, using an imprint apparatus defined in claim 3; and
   processing the substrate subjected to the imprint to manufacture the article.

8. An apparatus according to claim 1, wherein the apparatus comprises a plurality of the movement units.

9. An imprint apparatus for performing an imprint in which a resin on a substrate is molded using a mold and a pattern is formed on the substrate, the apparatus comprising:
   a press unit configured to press the mold to the resin on the substrate;
   a cure unit configured to irradiate light to the resin molded by the mold to cure the resin; and
   a movement unit configured to hold and move the substrate from a first position at which the press is performed by the press unit, via a second position at which the cure is performed by the cure unit, to a third position at which the substrate is exported from the movement unit;
   wherein the cure unit is configured to irradiate the light to the resin on the substrate with the substrate being moved by the movement unit from the first position to the third position.

10. An apparatus according to claim 9, further comprising:
    an alignment unit configured to perform alignment between the mold that has been pressed to the resin by the press unit and the substrate; and
    a fixation device configured to fix relative positions of the mold and the substrate between which the alignment has been performed by the alignment unit,
    wherein the movement unit is configured to move the mold and the substrate from the first position to the second position via a third position at which the alignment is performed by the alignment unit.

* * * * *